(12) United States Patent     (10) Patent No.: US 9,966,410 B1
Lim     (45) Date of Patent: May 8, 2018

(54) IMAGE SENSOR CIRCUIT AND IMAGE SENSING METHOD

(71) Applicant: PixArt Imaging (Penang) SDN. BHD., Penang (MY)

(72) Inventor: Wooi Kip Lim, Penang (MY)

(73) Assignee: PixArt Imaging (Penang) SDN. BHD., Penang (MY)

( * ) Notice: Subject to any disclaimer, the term of this patent is extended or adjusted under 35 U.S.C. 154(b) by 0 days. days.

(21) Appl. No.: 15/478,964

(22) Filed: Apr. 4, 2017

(51) Int. Cl.
    *H04N 5/378*     (2011.01)
    *H04N 5/353*     (2011.01)
    *H01L 27/146*     (2006.01)
    *H04N 5/369*     (2011.01)

(52) U.S. Cl.
    CPC ....... *H01L 27/14681* (2013.01); *H04N 5/353* (2013.01); *H04N 5/3698* (2013.01); *H04N 5/378* (2013.01)

(58) Field of Classification Search
    CPC H01L 27/14681; H04N 5/3698; H04N 5/378; H04N 5/353
    See application file for complete search history.

(56) References Cited

U.S. PATENT DOCUMENTS

| | | | | |
|---|---|---|---|---|
| 5,679,966 A | * | 10/1997 | Baliga | H01L 29/7391 257/139 |
| 7,956,913 B2 | * | 6/2011 | Rhodes | H04N 5/367 348/297 |
| 9,743,023 B2 | * | 8/2017 | Bol | H04N 5/3698 |
| 2002/0024605 A1 | * | 2/2002 | Merrill | H04N 5/353 348/296 |
| 2002/0084853 A1 | * | 7/2002 | Finlay | H03F 1/302 330/288 |
| 2009/0237544 A1 | * | 9/2009 | Hiyama | H04N 3/155 348/308 |

* cited by examiner

*Primary Examiner* — Hung Lam
(74) *Attorney, Agent, or Firm* — Tung & Associates

(57) ABSTRACT

An image sensor circuit, comprises: a photo sensing circuit including a photo sensitive device for sensing a light signal to generate a photo sensing signal at a photo sensing output node; a charge storage device, coupled to an integration node; an integration switch coupled between the photo sensing output node and the integration node, operating according to an integration control signal; and a reset circuit coupled between a voltage supply and the integration node, operating according to a reset control signal and a read control signal, wherein the integration node includes an integration voltage. In a reset time period, the integration switch is conductive, and the reset circuit generates a reset signal on the integration node to bias the photo sensitive device through the integration switch to an active state and to charge the charge storage device such that the integration voltage is determined to be at a reset level.

11 Claims, 3 Drawing Sheets

US 9,966,410 B1

IMAGE SENSOR CIRCUIT AND IMAGE SENSING METHOD

BACKGROUND OF THE INVENTION

Field of Invention

The present invention relates to an image sensor circuit. Particularly it relates to a high fill factor BJT image sensor circuit. The present invention also relates to an image sensing method.

Description of Related Art

A prior art image sensor circuit (image sensor circuit 1) is shown in FIG. 1, which senses alight signal by the photo sensing device Q1 to generate a differential output signal between nodes OUT1 and OUT2. The image sensor circuit 1 includes an integration switch M1, a bias switch M2, a reset switch M30, an NAND gate 11, a differential read-out circuit 12, and a capacitor CI. Referring to FIG. 2, the NAND gate 11 generates a control signal for controlling the reset switch M30 according to the reset control signal RST and the read control signal RD. An inverted integration control signal INTN is generated to control the integration switch M1 and the bias switch M2. Referring to both FIG. 1 and FIG. 2, in the idle time period (for example T1-T2 as shown in FIG. 2), the photo sensing device Q1 is biased to an active state by turning on the bias switch M2, and the capacitor CI is reset to a reset level by turning on the reset switch M30, and the integration switch M1 is off. In the shutter integration time period (T2-T3 as shown in FIG. 2), the integration switch M1 is conductive and both the bias switch M2 and the reset switch M30 are off, whereby the charges stored in the capacitor CI are discharged by the photo sensing device Q1 according to the intensity of the light signal which is proportional to the emitter current of the photo sensing device Q1. In the first read time period (T4-T5 as shown in FIG. 2), a differential pair including M5-M8 of the read-out circuit 12 senses the voltage on the integration node INT (i.e. VINT as shown in FIG. 2) to determine the differential output signal as a first output level. In the second read time period (T5-T6 as shown in FIG. 2), the differential pair senses the voltage on the integration node INT to determine the differential output signal as a second output level. By subtracting the first and the second output level by a transfer circuit (not shown), a complete photo sensing output signal (not shown) is generated.

A drawback of the prior art shown in FIG. 1 is that it requires 14 transistors to form a single pixel unit of the image sensor circuit, and hence the fill factor of the photo sensing device Q1 and the corresponding sensitivity are low. Because the sensitivity is low, the prior art requires higher lighting power (from for example an IR LED) for image sensing.

Compared to the prior art in FIG. 1, the present invention has an advantage that less transistors are required and hence a higher fill factor and higher sensitivity can be achieved. Therefore, the present invention can save lighting power (from for example an IR LED) as well as battery life for image sensing.

SUMMARY OF THE INVENTION

From one perspective, the present invention provides an image sensor circuit, comprising: a photo sensing circuit which includes a photo sensitive device, configured to operably sense a light signal to generate a photo sensing signal at a photo sensing output node; a charge storage device, coupled to an integration node; an integration switch which is coupled between the photo sensing output node and the integration node, operating according to an integration control signal; and a reset circuit coupled between a voltage supply and the integration node, operating according to a reset control signal and a read control signal, wherein the integration node includes an integration voltage; wherein in a reset time period, the integration switch is conductive, and the reset circuit generates a reset signal at the integration node to bias the photo sensitive device through the integration switch to an active state and to charge the charge storage device such that the integration voltage is determined to be at a reset level; wherein in a shutter integration time period, the integration switch is conductive and the reset circuit stops generating the reset signal at the integration node, whereby an accumulated number of charges in the charge storage device is changed by the photo sensing signal through the integration switch, such that the integration node is determined to be at an integrated level at a shutter off time point at which the integration switch is turned off; wherein the reset time period is prior to the shutter integration time period; wherein the image sensor circuit does not include a bias switch whose function is dedicated for controlling the biasing of the photo sensitive device in the reset time period.

In one embodiment, the image sensor circuit further includes a first level sensing circuit which is configured to operably generate a first output signal at a first output node according to the integration voltage, wherein in a first read time period, the reset circuit stops generating the reset signal and the integration switch is not conductive such that the first output signal is determined to be at a first output level, wherein the first read time period is posterior and close to the shutter integration time period.

In one embodiment, in a second read time period, the reset circuit generates a reference sensing signal to the integration node such that the first output signal is determined to be at a second output level, wherein the second read time period is posterior to the first read time period and is close to the first read time period.

In one embodiment, the image sensor circuit further includes a second level sensing circuit which is configured to operably generate a second output signal at a second output node in the first read time period or in a second read time period, wherein the second read time period is posterior to the first read time period and is close to the first read time period.

In one embodiment, the reset circuit includes a pair of switches which are connected in series and coupled between the voltage supply and the integration node, the pair of switches including a reset switch which operates according to the reset control signal and a non-read switch which operates according to the read control signal; wherein in the reset time period, the pair of switches are conductive for conducting the voltage supply to the integration node to bias the photo sensitive device through the integration switch to an active state and to charge the charge storage device such that the integration voltage is set to a reset level; wherein in the shutter integration time period, at least one of the pair of switches is not conductive, and the accumulated number of charges in the charge storage device is changed by the photo sensing signal through the integration switch, such that the integration node has an integrated level at a shutter off time point at which the integration switch is turned off; wherein in the first read time period, at least one of the pair of switches is not conductive, such that the first output signal is determined to be at a first output level; wherein in the second read time period, the pair of switches are conductive for conducting the voltage supply to the integration node as the reference sensing signal such that the first output signal is determined to be at a second output level.

In one embodiment, the first level sensing circuit includes a first level sensing device and a first read switch which are connected in series and are coupled to the first output node, wherein a sensing terminal of the first level sensing device is connected to the integration node for sensing the integration voltage to generate the first output signal, and the first read switch operates according to the read control signal.

In one embodiment, the first level sensing circuit includes a first level sensing device and a first read switch which are connected in series and are coupled to the first output node, wherein a sensing terminal of the first level sensing device is connected to the integration node for sensing the integration voltage to generate the first output signal, and the first read switch operates according to the read control signal.

In one embodiment, the second level sensing circuit includes a second level sensing device and a second read switch which are connected in series, wherein a sensing terminal of the second level sensing device is coupled to the voltage supply, and the second read switch operates according to the read control signal.

In one embodiment, the photo sensing circuit further includes a bias circuit coupled to the photo sensitive device and the integration switch, the bias circuit being configured to operably bias the photo sensitive device to the active state according to a current source and the reset signal.

From another perspective, the present invention provides an image sensing method, comprising: in a reset time period, biasing a photo sensitive device to an active state through a reset switch and an integration switch and charging a charge storage device through the reset switch, such that an integration voltage is set to a reset level, wherein the charge storage device, the integration switch, and the reset switch are coupled to an integration node which includes the integration voltage; and in a shutter integration time period, charging/discharging the charge storage device by the photo sensing device through the integration switch, such that the integration node is determined to be at an integrated level at a shutter off time point; wherein the reset time period is prior to the shutter integration time period; wherein the image sensor circuit does not include a bias switch whose function is dedicated for controlling the biasing of the photo sensitive device in the reset time period; wherein the reset switch and the integration switch operate according to a reset control signal and an integration control signal respectively.

In one embodiment, the image sensing method further comprises: generating a first output signal by a first level sensing device at a first output node according to the integration voltage through a first read switch which operates according to a read signal; wherein the step of generating the first output signal includes: in a first read time period, one switch of a pair of switches is not conductive and the integration switch is not conductive such that the first output signal is determined to be at a first output level, wherein the pair of switches includes the reset switch and a non-read switch which are connected in series, wherein the non-read switch operates according to the read control signal; wherein the first read time period is posterior and close to the shutter integration time period; in a second read time period, the pair of switches are conductive for conducting the voltage supply to the integration node such that the first output signal is determined to be at a second output level, wherein the second read time period is posterior to the first read time period and is close to the first read time period.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 3:
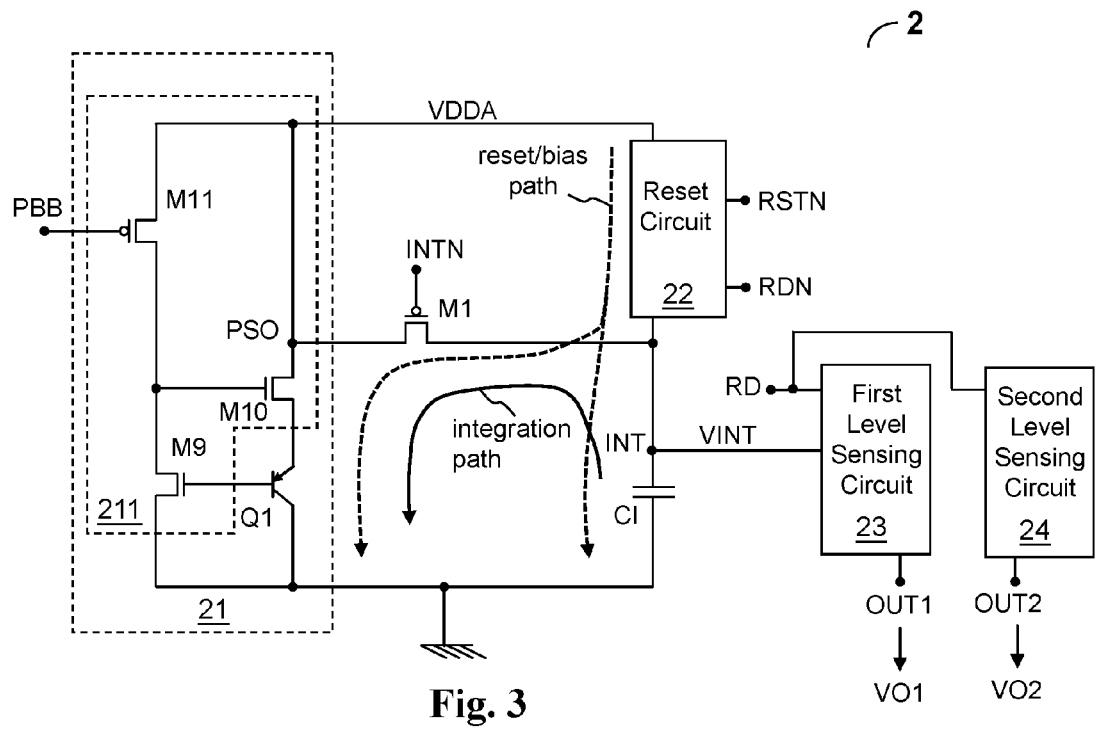
FIG. 3 shows a block diagram of an embodiment of the image sensor circuit according to the present invention.

FIG. 3 shows one preferred embodiment of the image sensor circuit according to the present invention (image sensor circuit 2). The image sensor circuit 2 comprises a photo sensing circuit 21, a charging capacitor CI, an integration switch M1 which is controlled by an integration control signal related signal (i.e., a signal related to the integration control signal, for example but not limited to an inverted integration control signal INTN), a reset circuit 22, and a first level sensing circuit 23. In one embodiment, the integration switch M1 may be a MOS transistor as shown in the figure.

Still referring FIG. 3, the photo sensing circuit 21 which includes a photo sensitive device Q1 is configured to operably sense a light signal by the photo sensitive device Q1 to generate a photo sensing signal at a photo sensing output node PSO. In one embodiment, the photo sensitive device Q1 may be for example a photo sensitive BJT (Bipolar Junction Transistor) as shown in the figure. The charging capacitor CI is connected to an integration node INT. Note that the charging capacitor CI may be other types of charge storage device and is not limited to a capacitor. The integration switch M1 is coupled between the photo sensing output node PSO and the integration node INT. The reset circuit is coupled between a voltage supply VDDA and the integration node CI, and is controlled by a reset control signal related signal (i.e., a signal related to the reset control signal, for example but not limited to an inverted reset control signal RSTN which is an inverted signal of the reset control signal RST) and a read control signal related signal (i.e., a signal related to the read control signal, for example but not limited to an inverted read control signal RDN which is an inverted signal of the read control signal RD), wherein the integration node CI includes an integration voltage VINT.

Figure 5:
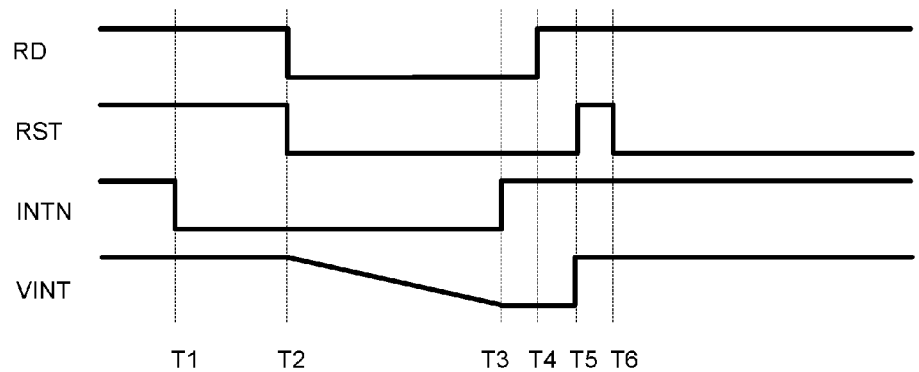
FIG. 5 shows simulation waveforms corresponding to the image sensor circuit according to the present invention shown in FIGS. 3 and 4.

FIG. 5 shows schematic waveforms corresponding to the image sensor circuit 2 shown in FIG. 3 according to the present invention. Referring to FIG. 3 and FIG. 5, in a reset time period (T1-T2 as shown in FIG. 5), the integration switch M1 is conductive, and the reset circuit 22 generates a reset signal at the integration node INT to bias the photo sensitive device Q1 through the integration switch M1 to an active state and to charge the charging capacitor CI such that the integration voltage VINT is set to a reset level. In one embodiment, the reset signal may be generated for example by conducting the voltage supply VDDA to the integration node INT, while in other embodiments, the reset signal may be generated by providing a predetermined voltage or current. After the reset time period, in a shutter integration time period (T2-T3 as shown in FIG. 5), the integration switch M1 is conductive and the reset circuit 22 stops generating the reset signal at the integration node INT, whereby the charging capacitor CI is discharged through the integration switch M1 by the photo sensing signal which for example is proportional to the intensity of the light signal, such that the integration voltage VINT has an integrated level at a shutter off time point T3 at which the integration switch M1 is turned off.

Referring to FIG. 3, the image sensor circuit 2 of the present invention further includes a first level sensing circuit 23 which is configured to operably generate a first output signal VO1 at a first output node OUT1 according to the integration voltage VINT. Referring to FIG. 5, in one embodiment, in a first read time period (for example T4-T5 as shown in FIG. 5), the reset circuit 22 stops generating the reset signal and the integration switch M1 is not conductive such that the first output signal VO1 is determined to be at a first output level which is related to the aforementioned integrated level. Note that the first read time period is posterior and close to the shutter integration time period.

Still referring to FIG. 5, in one embodiment, in a second read time period (for example T5-T6 as shown in FIG. 5), the reset circuit 22 generates a reference sensing signal at the integration node INT such that the first output signal VO1 is determined to be at a second output level, wherein the second read time period is posterior to the first read time period and is close to the first read time period. In one embodiment, the reference sensing signal is generated by conducting the voltage supply VDDA to the integration node INT. Besides, note that the second output level can be considered as a reference signal, and therefore the first output level and the second output level can be considered as a pair of differential signals, which for example can be combined by a transfer amplifier (not shown) to form a complete image sensor output signal (not shown) for post processing by for example an ADC (not shown) and other circuits.

Still referring to FIGS. 3 and 5, in one embodiment, optionally, the image sensor circuit 2 may further include a second level sensing circuit 24 which is configured to operably generate a second output signal VO2 at a second output node OUT2. Note that in this embodiment, the complete image sensor output signal may be obtained in various ways. For example, a first differential output level can be obtained by subtracting the second output signal VO2 from the first output signal VO1 in the first read time period, which can be used as the complete image sensor output signal. As another example, a second differential output level can be obtained by subtracting the second output signal VO2 from the first output signal VO1 in the second read time period, and the difference between the first and the second differential output levels is used as the complete image sensor output signal.

Still referring to FIG. 3, in one embodiment, the photo sensing circuit 21 further includes a bias circuit 211 coupled to the photo sensitive device Q1 and the integration switch M1. The bias circuit 211 is configured to operably bias the photo sensitive device Q1 to the active state with the reset signal, wherein the bias circuit 211 includes for example but not limited to a current source formed by a transistor M11, and a bias control unit formed by transistors M9 and M10 in this embodiment.

Note that the aforementioned "active state" indicates that the photo sensitive device Q1 is biased to a state at which for example the emitter and/or base voltages of the photo sensitive device Q1 are biased to a predetermined voltage level, and/or the emitter current of the photo sensitive device Q1 is biased to a predetermined current level, such that the current gain of the photo sensitive device Q1 is at a predetermined gain level.

Figure 4:
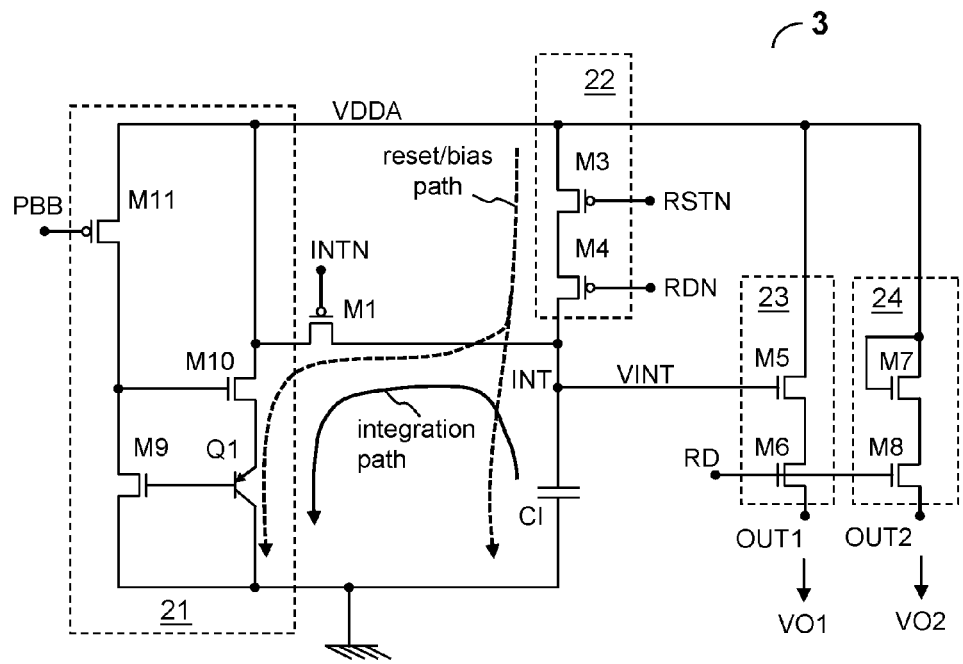
FIG. 4 shows a schematic diagram of an embodiment of the image sensor circuit according to the present invention.

Referring to FIG. 4 which shows a more specific schematic diagram of an embodiment of the image sensor circuit (image sensor circuit 3) according to the present invention, in one embodiment, the reset circuit 22 includes a pair of switches which are connected in series and coupled between the voltage supply VDDA and the integration node INT. The pair of switches includes a reset switch M3 controlled by the inverted reset control signal RSTN and a non-read switch M4 controlled by the inverted read control signal RDN.

Referring to FIGS. 4 and 5, FIG. 5 also shows schematic waveforms corresponding to the image sensor circuit 3 shown in FIG. 4 according to the present invention. In a reset time period (T1-T2 as shown in FIG. 5), the integration switch M1, the reset switch M3 and the non-read switch M4 are controlled to be conductive, such that the integration node INT is conducted to the voltage supply VDDA to bias the photo sensitive device Q1 to the active state and to charge the charging capacitor CI such that the integration voltage VINT is set to a reset level (i.e. VDDA in this embodiment). After the reset time period, in a shutter integration time period (T2-T3 as shown in FIG. 5), the integration switch M1 is controlled to be conductive and both the reset switch M3 and the non-read switch M4 are controlled to be off, whereby the charging capacitor CI is discharged by the photo sensing signal which for example is proportional to the intensity of the light signal, such that the integration voltage VINT has an integrated level at a shutter off time point T3 at which the integration switch M1 is turned off.

Still referring to FIG. 4, in one embodiment, the first level sensing circuit 23 includes a first level sensing device M5 and a first read switch M6 which are connected in series. In this embodiment, the first read switch M6 is controlled by the read control signal RD. The gate of the first level sensing device M5 is connected to the integration node INT for sensing the integration voltage VINT and generate the aforementioned first output signal VO1.

Still referring to FIGS. 4 and 5, in this embodiment, in a first read time period (for example T4-T5 as shown in FIG. 5), both the reset switch M3 and the non-read switch M4 are controlled to be off, and the integration switch M1 is controlled to be not conductive such that the first output signal VO1 is determined to be at a first output level which is related to the aforementioned integrated level.

Still referring to FIGS. 4 and 5, in one embodiment, in a second read time period (for example T5-T6 as shown in FIG. 5), both the reset switch M3 and the non-read switch M4 are controlled to be conductive for conducting the voltage supply to the integration node INT such that the first output signal VO1 is determined to be at a second output level. Note that the second output level can be considered as a reference signal, and therefore the first output level and the second output level can be considered as a pair of differential signals, which for example can be combined by a transfer amplifier (not shown) to form a complete image sensor output signal (not shown) for post processing by for example an ADC (not shown) and etc.

Still referring to FIG. 4, in one embodiment which includes the second level sensing circuit 24 (which is optional), the second level sensing circuit 24 includes a second level sensing device M7 and a second read switch M8 which are connected in series. In this embodiment, the first read switch M8 is controlled by the read control signal RD and is conductive in the first and the second read time period. The gate of the second level sensing device M7 is connected to the voltage supply VDDA for generating the second output signal VO2 at the second output node OUT2. Note that in this embodiment, the complete image sensor output signal may be obtained in various ways. For example, the first differential output level can be obtained by subtracting the second output signal VO2 from the first output signal VO1 in the first read time period, which can be used as the complete image sensor output signal. As another example, the second differential output level can be obtained by subtracting the second output signal VO2 from the first output signal VO1 in the second read time period, and the difference between the first and the second differential output levels is used as the complete image sensor output signal.

Figure 1:
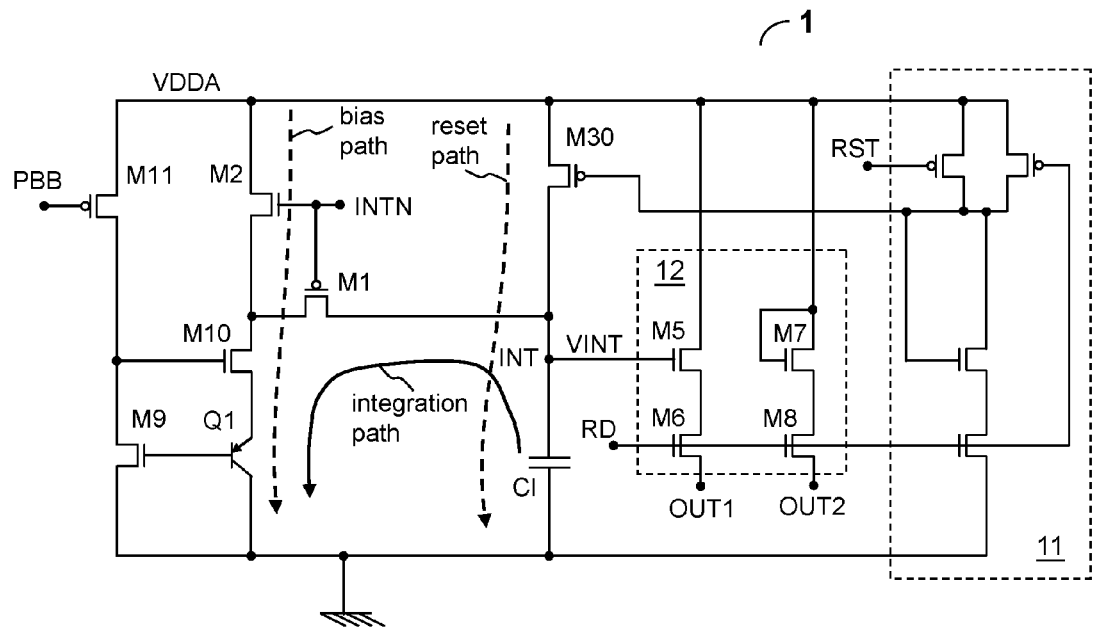
FIG. 1 shows a schematic diagram of a prior art image sensor circuit.
Figure 2:
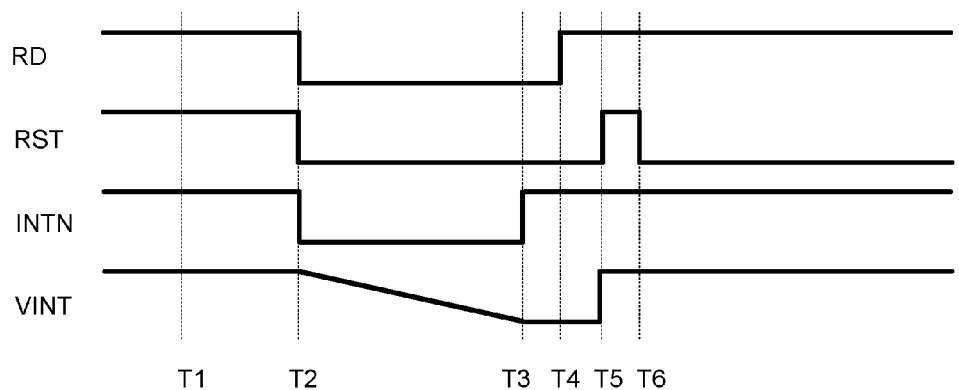
FIG. 2 shows simulation waveforms corresponding to the prior art image sensor circuit shown in FIG. 1.

Note that compared to the prior art, the reset circuit 22 of the image sensor circuit 2 or 3 according to the present invention provides both the biasing control function for the photo sensing device Q1 and the reset control function for the charging capacitor CI at the same time in the reset time period (for example the "reset/bias path" as shown in FIGS. 3 and 4). And the integration switch M1 is conductive both in the reset time period and the shutter integration time period. Hence a dedicated bias switch (the bias switch M2 of the prior art image sensor circuit 1, whose function is dedicated for controlling the biasing of the photo sensitive device in the reset time period) is not required in the present invention. From another perspective, another difference between the present invention and the prior art is that the integration switch M1 is controlled to be conductive earlier, that is, in the reset time period which is prior to the integration time period (see the inverted integration control signal INTN as shown in FIG. 5). Also note that the NAND gate 11 and the reset switch M30 of the prior art image sensor circuit 1 as shown in FIG. 1 are simplified into a pair of switches in the present invention (i.e. the reset switch M3 and non-read switch M4 shown in FIG. 4), so the required number of transistors are reduced. Furthermore, in the embodiment which does not include the second level sensing circuit 24 (i.e. the image sensor circuit 2 or 3 without the second level sensing circuit 24), two more switches can be omitted. Therefore, the present invention can save up to six transistors in total as compared to the prior art, and hence the fill factor can be greatly improved.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, the P and N types of MOS transistors or the PNP BJT in the aforementioned figures can be replaced by their complimentary types of transistors to form an image sensor circuit with fully or partial complimentary configuration. As an example, the photo sensitive PNP BJT Q1 may be replaced by an NPN BJT with a complimentary configuration, in this circumstance, the polarity of the transistors or the charging/discharging directions may be rearranged or switched accordingly. As another example, the aforementioned switches (e.g. the integration switch, the reset switch, or the read/non-read switches) may include for example but not limited to other types of transistors, such as JFET or depletion mode MOSFET, or bipolar transistors and etc. As another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. An image sensor circuit, comprising:
 a photo sensing circuit which includes a photo sensitive device, configured to operably sense a light signal to generate a photo sensing signal at a photo sensing output node;
 a charge storage device, coupled to an integration node;
 an integration switch which is coupled between the photo sensing output node and the integration node, operating according to an integration control signal; and
 a reset circuit coupled between a voltage supply and the integration node, operating according to a reset control signal and a read control signal, wherein the integration node includes an integration voltage;
 wherein in a reset time period, the integration switch is conductive, and the reset circuit generates a reset signal at the integration node to bias the photo sensitive device through the integration switch to an active state and to charge the charge storage device such that the integration voltage is determined to be at a reset level;
 wherein in a shutter integration time period, the integration switch is conductive and the reset circuit stops generating the reset signal at the integration node, whereby an accumulated number of charges in the charge storage device is changed by the photo sensing signal through the integration switch, such that the integration node is determined to be at an integrated level at a shutter off time point at which the integration switch is turned off;
 wherein the reset time period is prior to the shutter integration time period;
 wherein the image sensor circuit does not include a bias switch whose function is dedicated for controlling the biasing of the photo sensitive device in the reset time period.

2. The image sensor circuit of claim 1, further including a first level sensing circuit which is configured to operably generate a first output signal at a first output node according to the integration voltage, wherein in a first read time period, the reset circuit stops generating the reset signal and the integration switch is not conductive such that the first output signal is determined to be at a first output level, wherein the first read time period is posterior and close to the shutter integration time period.

3. The image sensor circuit of claim 2, wherein in a second read time period, the reset circuit generates a reference sensing signal to the integration node such that the first output signal is determined to be at a second output level, wherein the second read time period is posterior to the first read time period and is close to the first read time period.

4. The image sensor circuit of claim 2, further including a second level sensing circuit which is configured to operably generate a second output signal at a second output node in the first read time period or in a second read time period, wherein the second read time period is posterior to the first read time period and is close to the first read time period.

5. The image sensor circuit of claim 3, wherein the reset circuit includes a pair of switches which are connected in series and coupled between the voltage supply and the integration node, the pair of switches including a reset switch which operates according to the reset control signal and a non-read switch which operates according to the read control signal;
wherein in the reset time period, the pair of switches are conductive for conducting the voltage supply to the integration node to bias the photo sensitive device through the integration switch to an active state and to charge the charge storage device such that the integration voltage is set to a reset level;
wherein in the shutter integration time period, at least one of the pair of switches is not conductive, and the accumulated number of charges in the charge storage device is changed by the photo sensing signal through the integration switch, such that the integration node has an integrated level at a shutter off time point at which the integration switch is turned off;
wherein in the first read time period, at least one of the pair of switches is not conductive, such that the first output signal is determined to be at a first output level;
wherein in the second read time period, the pair of switches are conductive for conducting the voltage supply to the integration node as the reference sensing signal such that the first output signal is determined to be at a second output level.

6. The image sensor circuit of claim 2, wherein the first level sensing circuit includes a first level sensing device and a first read switch which are connected in series and are coupled to the first output node, wherein a sensing terminal of the first level sensing device is connected to the integration node for sensing the integration voltage to generate the first output signal, and the first read switch operates according to the read control signal.

7. The image sensor circuit of claim 5, wherein the first level sensing circuit includes a first level sensing device and a first read switch which are connected in series and are coupled to the first output node, wherein a sensing terminal of the first level sensing device is connected to the integration node for sensing the integration voltage to generate the first output signal, and the first read switch operates according to the read control signal.

8. The image sensor circuit of claim 4, wherein the second level sensing circuit includes a second level sensing device and a second read switch which are connected in series, wherein a sensing terminal of the second level sensing device is coupled to the voltage supply, and the second read switch operates according to the read control signal.

9. The image sensor circuit of claim 1, wherein the photo sensing circuit further includes a bias circuit coupled to the photo sensitive device and the integration switch, the bias circuit being configured to operably bias the photo sensitive device to the active state according to a current source and the reset signal.

10. An image sensing method, comprising:
in a reset time period, biasing a photo sensitive device to an active state through a reset switch and an integration switch and charging a charge storage device through the reset switch, such that an integration voltage is set to a reset level, wherein the charge storage device, the integration switch, and the reset switch are coupled to an integration node which includes the integration voltage; and
in a shutter integration time period, changing an accumulated number of charges in the charge storage device by the photo sensing device through the integration switch, such that the integration node is determined to be at an integrated level at a shutter off time point;
wherein the reset time period is prior to the shutter integration time period;
wherein the image sensor circuit does not include a bias switch whose function is dedicated for controlling the biasing of the photo sensitive device in the reset time period;
wherein the reset switch and the integration switch operate according to a reset control signal and an integration control signal respectively.

11. The image sensing method of claim 10, further comprising:
generating a first output signal by a first level sensing device at a first output node according to the integration voltage through a first read switch which operates according to a read signal;
wherein the step of generating the first output signal includes:
in a first read time period, one switch of a pair of switches is not conductive and the integration switch is not conductive such that the first output signal is determined to be at a first output level, wherein the pair of switches includes the reset switch and a non-read switch which are connected in series, wherein the non-read switch operates according to the read control signal; wherein the first read time period is posterior and close to the shutter integration time period;
in a second read time period, the pair of switches are conductive for conducting the voltage supply to the integration node such that the first output signal is determined to be at a second output level, wherein the second read time period is posterior to the first read time period and is close to the first read time period.

* * * * *